(12) United States Patent
Rahimo et al.

(10) Patent No.: US 12,525,527 B2
(45) Date of Patent: Jan. 13, 2026

(54) SEMICONDUCTOR MODULE (71) Applicant: MTAL GMBH, Solothurn (CH)

(72) Inventors: Munaf Rahimo, Solothurn (CH); Ulrich Schlapbach, Bern (CH)

(73) Assignee: MTAL GMBH, Gaensbrunnen (CH)

( * ) Notice: Subject to any disclaimer, the term of this patent is extended or adjusted under 35 U.S.C. 154(b) by 428 days.

(21) Appl. No.: 18/153,492

(22) Filed: Jan. 12, 2023

(65) Prior Publication Data
US 2023/0223331 A1    Jul. 13, 2023

(51) Int. Cl.
*H01L 23/498*    (2006.01)
*H01L 23/00*    (2006.01)
(Continued)

(52) U.S. Cl.
CPC .... *H01L 23/49861* (2013.01); *H01L 23/3121* (2013.01); *H01L 23/367* (2013.01); *H01L 23/3735* (2013.01); *H01L 23/49822* (2013.01); *H01L 23/5383* (2013.01); *H01L 24/32* (2013.01); *H01L 24/48* (2013.01); *H01L 24/49* (2013.01); *H01L 25/072* (2013.01); *H01L 24/33* (2013.01); *H01L 2224/32245* (2013.01); *H01L 2224/33181* (2013.01); *H01L 2224/48091* (2013.01); *H01L 2224/48101* (2013.01); *H01L 2224/48105* (2013.01); *H01L 2224/48137* (2013.01); *H01L 2224/48175* (2013.01); *H01L 2924/10253* (2013.01); *H01L 2924/10272* (2013.01); *H01L 2924/1033* (2013.01);
(Continued)

(58) Field of Classification Search
None
See application file for complete search history.

(56) References Cited

U.S. PATENT DOCUMENTS

| | | | |
|---|---|---|---|
| 3,763,403 A | 10/1973 | Lootens | |
| 2011/0037166 A1* | 2/2011 | Ikeda | H01L 24/73 |
| | | | 257/E23.101 |

(Continued)

OTHER PUBLICATIONS

GB Search Report dated Feb. 8, 2022 for corresponding GB Application No. 2200412.1.

*Primary Examiner* — Sue A Purvis
*Assistant Examiner* — Jordan M Klein
(74) *Attorney, Agent, or Firm* — Tarolli, Sundheim, Covell & Tummino LLP (57) ABSTRACT

A module arrangement for power semiconductor devices, includes two or more heat spreading layers with a first surface and a second surface being arranged opposite to the first surface. At least two or more power semiconductor devices are arranged on the first surface of the heat spreading layer and electrically connected thereto. An electrical isolation stack comprising an electrically insulating layer and electrically conductive layers is arranged in contact with the second surface of each heat spreading layer. The at least two or more power semiconductor devices, the heat spreading layers and a substantial part of each of the electrical isolation stacks are sealed from their surrounding environment by a molded enclosure. Accordingly, similar or better thermal characteristics of the module can be achieved instead of utilizing high cost electrically insulating layers, and double side cooling configurations can be easily implemented, without the use of a thick baseplate.

11 Claims, 4 Drawing Sheets

(51) Int. Cl.
*H01L 23/31* (2006.01)
*H01L 23/367* (2006.01)
*H01L 23/373* (2006.01)
*H01L 23/538* (2006.01)
*H01L 25/07* (2006.01)

(52) U.S. Cl.
CPC ............... *H01L 2924/1301* (2013.01); *H01L 2924/13055* (2013.01); *H01L 2924/13091* (2013.01)

(56) References Cited

U.S. PATENT DOCUMENTS

| | | |
|---|---|---|
| 2019/0103340 A1 | 4/2019 | Tsuchimochi |
| 2020/0176354 A1* | 6/2020 | Matsuzawa ............. H01L 24/33 |
| 2022/0270948 A1* | 8/2022 | Ukegawa .......... H01L 23/49562 |

* cited by examiner

SEMICONDUCTOR MODULE

CROSS-REFERENCE TO RELATED APPLICATIONS

The present application claims priority to GB Patent Application No. GB2200412.1 filed on 13 Jan. 2022. The entirety of this application is hereby incorporated by reference for all purposes.

FIELD OF THE INVENTION

The invention relates to the field of semiconductor modules. More particularly it relates to a module for power semiconductor devices with capability to provide a reliable protection and efficient cooling for the semiconductor devices.

BACKGROUND

Improving the electrical performance of power semiconductors like IGBTs and MOSFETs has been the driving force in the industry for the last decades. Significant improvements have been achieved over the last years in increasing the performance of the semiconductor devices at bare die level. However, for successful implementation in any real-world applications, the semiconductor devices must be arranged in enclosures or packages that provide protection against environmental influences and enable efficient dissipation of the thermal heat generated by the losses of the semiconductor device. In particular, with increasing power density of the semiconductor devices i.e. having smaller and smaller die sizes, it has proved more and more challenging to efficiently dissipate the generated heat, while providing the required level of protection against environmental influences such as humidity, moisture, high electrical fields etc.

Different power semiconductor device package concept exists in the market. They are based on different structures depending on the targeted applications. The three main concepts can be listed as follow:
1) Discrete packages such as TO-247, TO-220 or the SOT-227 (ISOPAK) with very few chips per package. These discrete packages are mostly protected by molded enclosures.
2) Multi-chip Insulated Packages such as the industry standards 34 mm, 62 mm, Econopack, Primepack, High Voltage E-modules, etc. These packages employ a thick baseplate 14 with isolated substrates 3 (usually DCB), wherein the semiconductor devices are attached to the isolated substrates and protected by silicon gel 16;
3) Press packages including standard "hockey puck" or other concepts such as Stakpak.
  "Hockey pucks" are normally enclosing the semiconductor devices in a hermetically sealed environment. For IGBTs, multi-chip technology requires special multi-press arrangements and related technologies.

The package concept defines if the heat sink or cooler attached to the module is connected to the high voltage potential or if it is electrically isolated. Press-pack type modules are mostly not isolated and hence are more suitable for series connection such as for very high voltages application like High Voltage DC transmission (HVDC). Also, most of the discrete packages are not insulated due to the small cooler footprint and the related assembly technology. However, most of the applications require electrical isolated modules such as the one depicted in FIG. 1 with the power semiconductor devices 7 arranged on an electrical isolation stack 3 (usually comprising a ceramic material 6), which is attached to a baseplate 14 for conducting the heat generated by the semiconductor devices 7 to a heatsink (not shown). The baseplate 14 is in contact with a module frame 15 defining an internal volume of the module 200. In order to prevent moisture and other contaminants from penetrating into the module inner volume, and reaching the power semiconductor devices 7, silicone gel 16 is applied in the module. One limitation of this type of module is the low thermal conductivity of the isolation stack 3 which prevents efficient transfer of the heat generated by the losses in the semiconductor device 7 to the baseplate 14. It is possible to use improved ceramics or other materials with increased thermal conductivity, but these are usually very expensive. There are also modules that use resin or organic material instead of silicone gel 16, but such materials have lower thermal conductivity and generate additional reliability issues. A further limitation of this approach is the reduced module capability during thermal cycling, which introduces delamination and cracks in the soldering layers between the baseplate 14 and the electrical isolation substrate 3 due to the mismatch between the coefficient of thermal expansion (CTE) of the ceramic substrate 6 and that of the baseplate 14. Furthermore, as the electrical isolation stack 3 is in contact with the power terminals 10 of the module 200, there could be additional reliability issues related to these connection points due to the forces generated by the movement of the power terminals 10 (attached to the frame 15) during heating and cooling cycles of the module, or the excessive heating of the terminals due to conducting very high currents.

Figure 2:
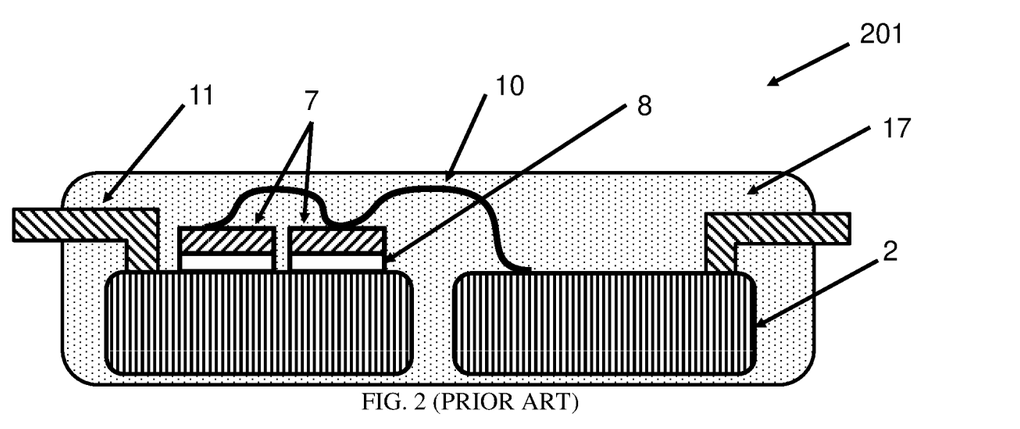
FIG. 2: shows the cross section of a molded module arrangement for semiconductor devices (prior art).

Recently, a new class of modules were developed, similar to the discrete packages (i.e. using mold for package protection) while utilizing a high number of parallel semiconductor devices to achieve high current ratings. This provides a low cost, insulated and reliable package platforms for demanding applications such as Electrical Vehicles. One of the first modules utilising such concepts is the Smartpack disclosed in the patent ES 2 078 171 B1. The module arrangement 201 depicted in FIG. 2 depicts the power semiconductor devices 7 arranged on a relatively thick metal layer or heat spreading layer 2 (usually Copper) which absorbs the heat generated by the losses in the semiconductor devices 7. There is no insulator substrate, instead the semiconductor devices 7 and the heat spreading layer 2 on which they are attached, are hermetically enclosed in a volume of mold or resin material 17. This provides the highest level of reliable protection against environmental influences. One limitation of this type of module is that the heat spreading layers 2 are also separated from the environment by parts of the moulded volume 17 to ensure electrical isolation, and a baseplate cannot be directly brought in contact with the heat spreading layers 2, and thus the thermal conductivity of the module is significantly reduced.

It is thus necessary to identify improved module arrangements that overcome the thermal limitations described above, while providing reliable protection of the semiconductor devices inside the module, maintaining the highest thermal cycling capability and focusing on low cost approaches.

SUMMARY

It is therefore an object of the present invention to provide an improved semiconductor module which allows an especially reliable protection of the semiconductor devices and thus reliable performance, while providing a high thermal conductivity path to transporting the heat generated in the semiconductor devices to the surrounding environment and/or a baseplate.

According to the invention, we describe a semiconductor module comprising at least one heat spreading layer with a first surface and a second surface being arranged opposite to the first surface, wherein the heat spreading layer is formed out of an electrically and thermally conductive material like Copper. Two or more power semiconductor devices are arranged on the first surface of the heat spreading layer and electrically connected thereto by low temperature sintering, soldering or other similar methods. An electrical isolation stack comprising electrically conductive layers and electrically insulating layer is arranged on the second surface of the heat spreading layer. The isolation stack has a first surface and an opposite second surface, and comprises a layer which is at least partially electrically insulating and electrically insulates the semiconductor devices from the environment. In one embodiment, the electrical isolation stack can be structured as a low-cost Direct Copper Bonded substrate with Al2O3 ceramic as electrically insulating layer. The first surface of the isolation stack is connected to the heat spreading layer and the second surface of the isolation stack is attached to a heatsink (directly or with an additional contact layer such as thermal interface material) to provide improved thermal performance. The thickness of the heat spreading layer is an order of magnitude larger than the thicknesses of other layers. In a top plane view, the size of the heat spreading layer can be similar or larger than the size of the electrical isolation stack. The power semiconductor devices, the heat spreading layer, and the isolation stack are enclosed in a mold leaving only the second surface of the isolation stack exposed to the surrounding environment.

The module further comprises electrical connections such as wire bonds or other joining structures to connect the semiconductor devices to other semiconductor devices, to heat spreading layers or to power and control terminals.

Unlike in traditional modules, the electrical isolation stack is used only for electrical isolation purposes and not for connecting power terminals. Instead, the power terminals are connected through soldering, bonding, ultrasonic welding or riveting to the heat spreading layers. Thus, the reliability of the module during thermal cycling is increased.

Multiple heat spreading layers can be used in a single module encapsulation with some heat spreading layers serving for connecting power terminals, or integrating control, sensors or gate drive electronics. Different heat spreading layers can be connected with each other via metal layers, or can be separated from each other.

Optionally, the shape of the heat spreading layer in a top plane view can be of squares, rectangles or other polygons.

These objects may be met by the subject matter of the independent claims. Embodiments of the invention are described with respect to the dependent claims.

The new module offers a wide range of advantages both in terms of performance (improved thermal conductivity and reliability), and processability (the semiconductor device, the heat spreading layer and the electrical isolation stack can be connected during the same processing step) with the potential of applying silicon and wide bandgap (WBG) power semiconductor devices in the module.

BRIEF DESCRIPTION OF THE DRAWINGS

The embodiments of the invention will be explained in more detail in the following text with reference to the attached drawings, in which.

The reference symbols used in the figures and their meaning are summarized in the list of reference symbols. The drawings are only schematically and not to scale. Generally, alike or alike-functioning parts are given the same reference symbols. The described embodiments are meant as examples and shall not confine the invention.

DETAILED DESCRIPTION

Figure 3:
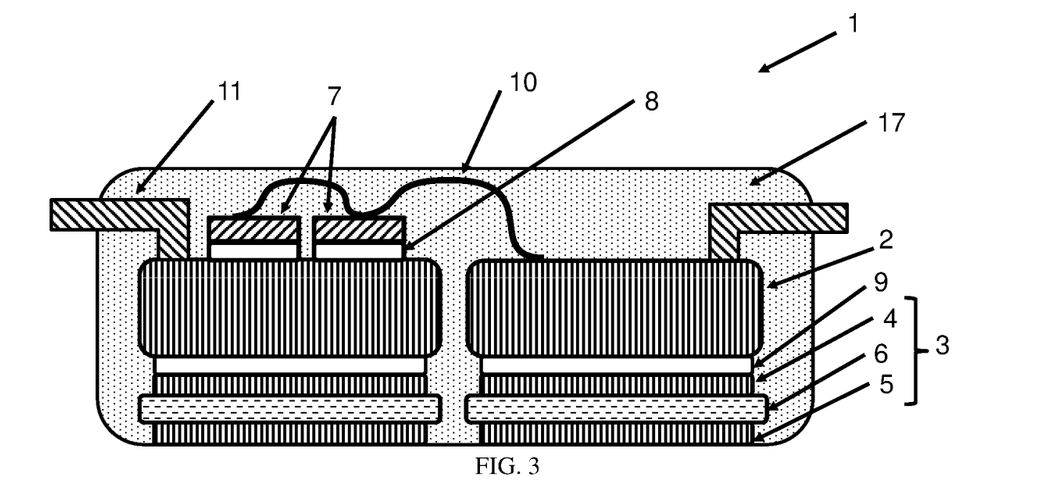
FIG. 3: shows the cross section of a module arrangement for semiconductor devices according to a first embodiment.
Figure 5:
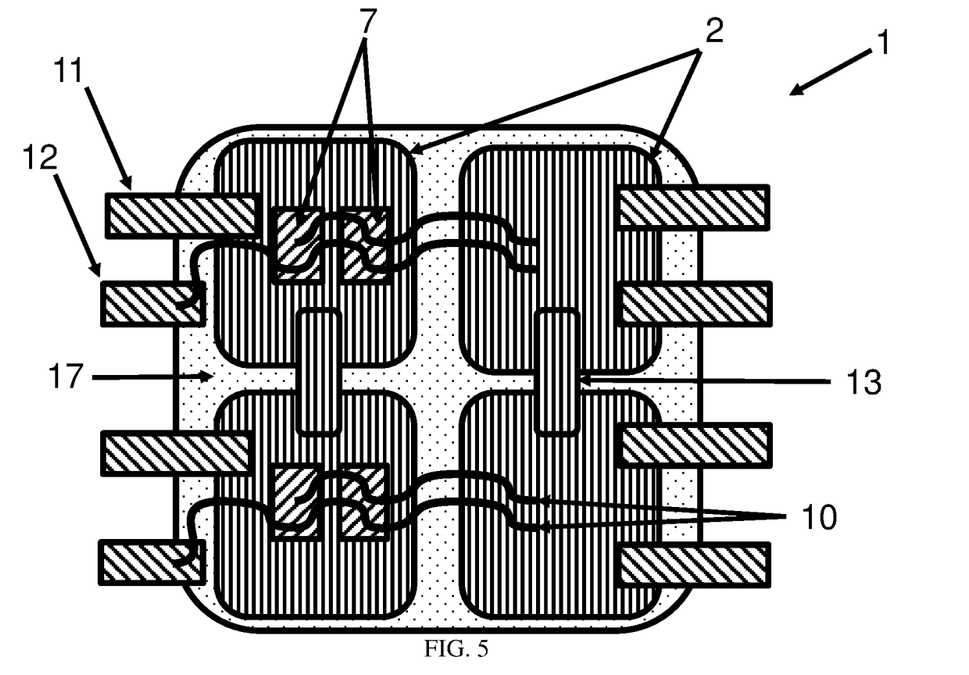
FIG. 5: shows a top plane view of a module arrangement for semiconductor devices according to the first or second embodiments of the invention.

FIG. 3 shows a cross section and FIG. 5 shows a top plane view of the first exemplary embodiment of a module 1 comprising multiple heat spreading layers 2. A module 1 according to the invention can comprise one or more multiple heat spreading layers 2. Each heat spreading layer 2 has a first surface and a second surface being arranged opposite to the first surface and is formed of highly electrically and thermally conductive material, for example Copper.

On the first surface of some or all heat spreading layers 2 there could be attached two or more semiconductor devices 7, which are connected to the corresponding heat spreading layers 2 through joining layers 8 formed through soldering or low temperature sintering or other similar processes. The semiconductor devices 7 have small sizes, which is more relevant to the latest developments in the field, while utilizing wide bandgap semiconductor materials like SiC, GaN and alike. The small size of the semiconductor dies 7 is expected to provide improvements in the power cycling capability of the module and substantial reduction of the thermal resistance $R_{th}$. The semiconductor devices 7 may comprise control regions to apply voltage or current control signals, and current flow regions. This is typical the case for controllable semiconductor devices like IGBTs or MOSFET or thyristors.

On the second surface of some or all heat spreading layers 2 there could be arranged an electrical isolation stack 3 comprising at least an electrically insulating layer 6 and one or more electrically conductive layers 4 and 5. The electrical isolation stack 3 has a first surface on the side of the electrical conductive layer 4 and a second surface opposite the first surface, on the side of the electrical conductive layer 5 and comprises an electrically insulating layer 6, which is at least partially electrically insulating and electrically insulates the semiconductor devices 7. In one embodiment, the electrical isolation stack 3 can be structured as a low-cost Direct Copper Bonded substrate with Al2O3 ceramic as electrically insulating layer 6 and copper as the material for conductive layers 4 and 5. The conductive layer 4 at the first surface of the isolation stack 3 is connected to the heat spreading layer 2 using the joining layer 9. The conductive layer 5 at the second surface of the isolation stack 3 may be attached to a heatsink (directly or with an additional contact layer such as thermal interface material) to provide improved thermal performance.

Figure 4:
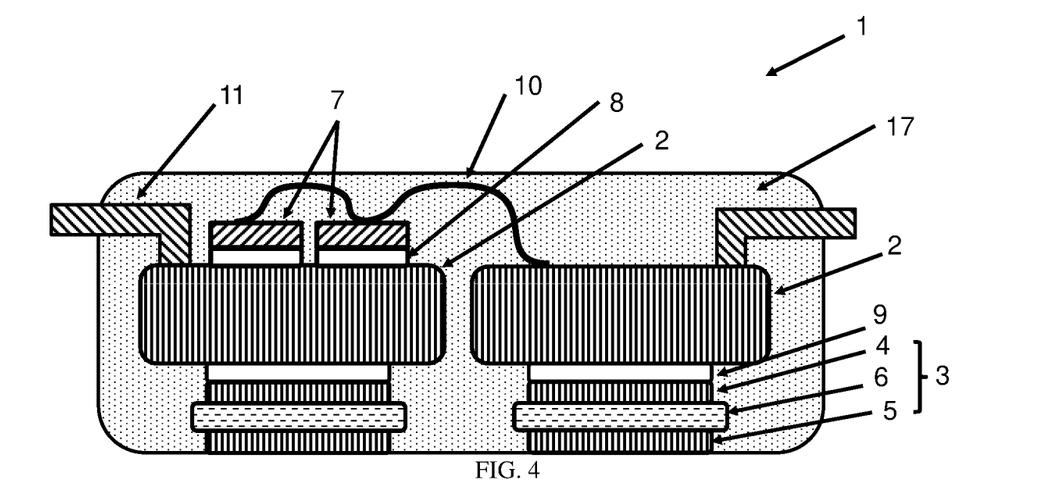
FIG. 4: shows the cross section of a module arrangement for semiconductor devices according to a second embodiment of the invention.

The thickness of the heat spreading layer 2 is an order of magnitude larger (i.e. significantly larger) than the thicknesses of other layers 4, 5, 6, 8 or 9. The power semiconductor devices 7, the heat spreading layer 2, the electrical connections 10, and the electrical isolation stack 3 are enclosed in a volume of mold or resin 17 leaving only the second surface 5 of the isolation stack 3 exposed to the surrounding environment. In a top plane view, the area of the heat spreading layer 2 can be similar (as shown in FIG. 3) or larger than the area of the isolation stack 3 as shown in a second embodiment of FIG. 4.

With a module arrangement as shown in FIG. 3, the heat generated by the losses of the semiconductor devices 7 is efficiently removed i.e. the thermal resistivity of the module arrangement is reduced, while providing the required electrical isolation of the semiconductor devices 7. The inventor calculated that the present invention delivers the most improvement potential when using electrically insulating layer 6 made of materials having a thermal conductivity above 10 W/m·K but lower than 50 W/m·K, for example $Al_2O_3$ which is a low-cost, widely available ceramic material. Silicon Nitride is also applicable as a material for the electrically insulating layer 6 due to its low thermal conductivity characteristics.

The module further comprises wire bonds 10 or other joining structures like metal ribbons, to connect the semiconductor devices 7 to other semiconductor devices, to heat spreading layers 2 and to power and control terminals as shown in a top plane view of module 1 in FIG. 5. Because of the overlap between the heat spreading layers 2 and the electrical isolation layers 3, the FIG. 5 does not show the latter. The power terminals 11 are electrically conductive structures in contact with the heat spreading layer 2 and the current flow regions of the semiconductor devices 7, and conduct the external flow of electrical currents to the semiconductor devices. The control terminals 12 are electrically conductive structures that allow the external control voltages or currents to be applied to the control regions of semiconductor devices 7 (if applicable).

Figure 1:
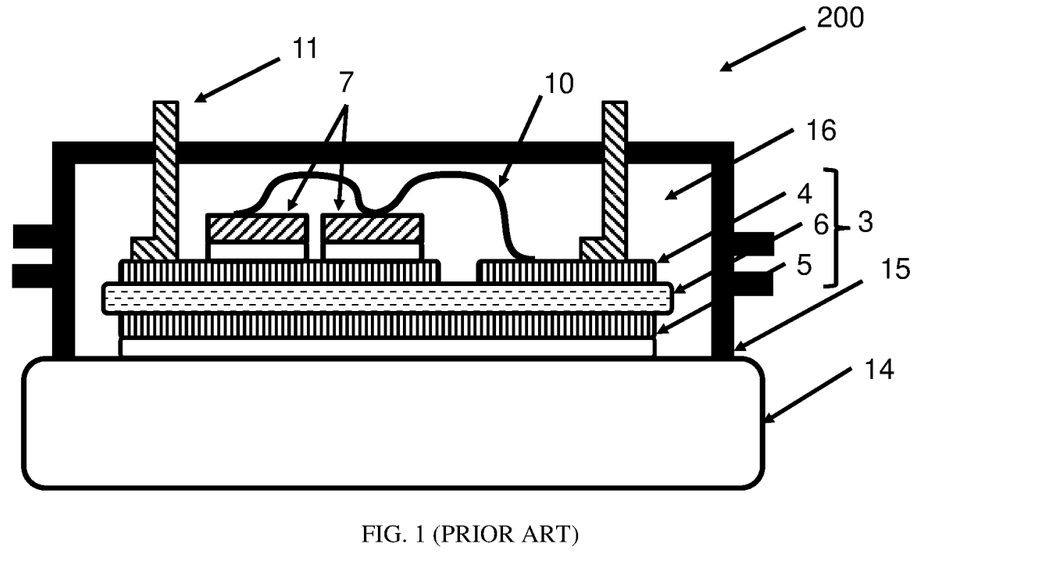
FIG. 1: shows the cross section of a baseplate insulated module arrangement for semiconductor devices (prior art).

Unlike in prior-art modules depicted in FIG. 1, the electrical isolation stack 3 is used only for electrical insulation purposes and not for connecting power terminals 11. Instead, the power terminals 11 are connected through soldering, bonding, ultrasonic welding or riveting to the heat spreading layers 2. Thus, the reliability of the module during thermal cycling is increased.

Multiple heat spreading layers 2 can be used in a single module encapsulation with some heat spreading layers 2 serving for connecting power terminals 11, or integrating control, sensors or gate drive electronics. Different heat spreading layers 2 can be connected with each other via internal connection layers 13 or can be electrically separated from each other as depicted in FIG. 5.

Optionally, the shape of the heat spreading layer 2 in a top plane view can be that of squares, rectangles or other polygons. The area of the heat spreading layer 2 in a top plane view may range between a minimum value constrained by the requirement of attaching two or more semiconductor devices 7 on its first surface, and a maximum value constrained by the CTE mismatch and requirements of thermal cycling capability. The area of the heat spreading layer 2 could be smaller than 10 cm², more preferably smaller than 4 cm², and more preferably between 1-3 cm².

The thickness of the heat spreading layer 2 could be smaller than 10 mm, more preferably smaller than 5 mm and more preferably between 1-5 mm. Because of the excellent thermal conductivity of the heat spreading layer 2, the thermal resistance $R_{th}$ from semiconductor devices 7 to the heatsink would be reduced to values that are only reachable in prior art module arrangement only by using electrically insulating layers 6 made of very expensive AlN, AlSiC, or SiN or similar.

Figure 6:
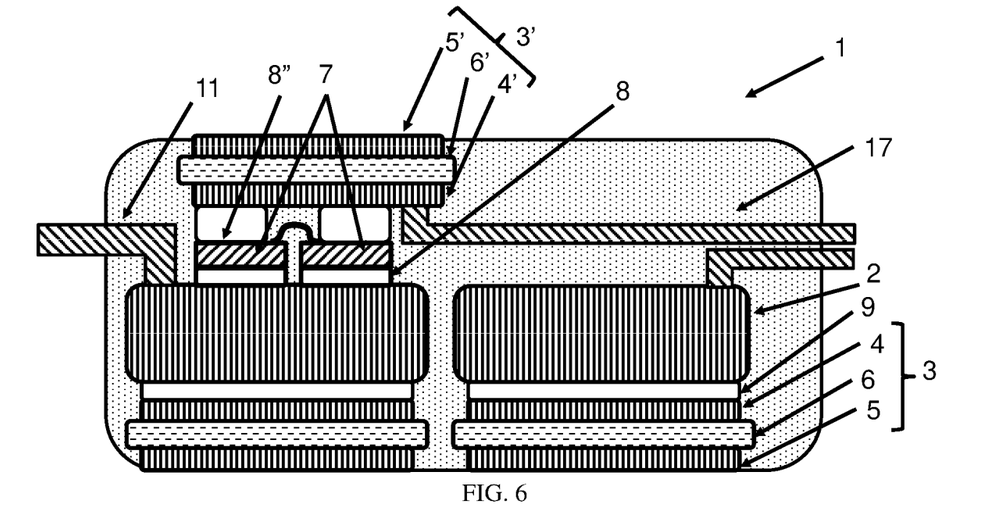
FIG. 6: shows the cross section of a module arrangement for semiconductor devices according to a third embodiment of the invention.

Furthermore, in a third embodiment as depicted in FIG. 6, a second electrical isolation stack 3' can be attached on the first surface of the semiconductor devices 7 (i.e. opposite the semiconductor surface adjacent to the joining layer 8). More specifically, the conductive layer 4' on a first surface of the second electrical isolation stack 3' is in contact with the first surface of the semiconductor devices 7 through a joining layer 8". The thickness of the joining layer 8" should be large enough to accommodate electrical contacts to the control regions of the semiconductor devices 7 without electrical shorting of the conductive layer 4' as depicted by the small wire contact between the semiconductor devices 7 in FIG. 6. The electrically insulating layer 6 of the electrical isolation stack 3 and the electrically insulating layer 6' of the second electrical isolation stack 3' can be made of similar or different materials, and can have similar or different properties (i.e. thickness, etc). The electrically conductive layers 4 and 5 of the first electrical isolation stack 3 and the electrically conductive layers 4' and 5' of the second electrical isolation stack 3' can be made of similar or different materials, and can have similar or different properties (i.e. thickness, etc). The power semiconductor devices 7, the heat spreading layer 2, the first electrical isolation stack 3, the second electrical isolation stack 3' are enclosed in a volume of mold or resin 17, leaving only the layer 5 of the first isolation stack 3 and the layer 5' of the second isolation stack 3' exposed to the surrounding environment. Such a module arrangement could provide capability for double side cooling of the semiconductor devices 6.

Figure 7:
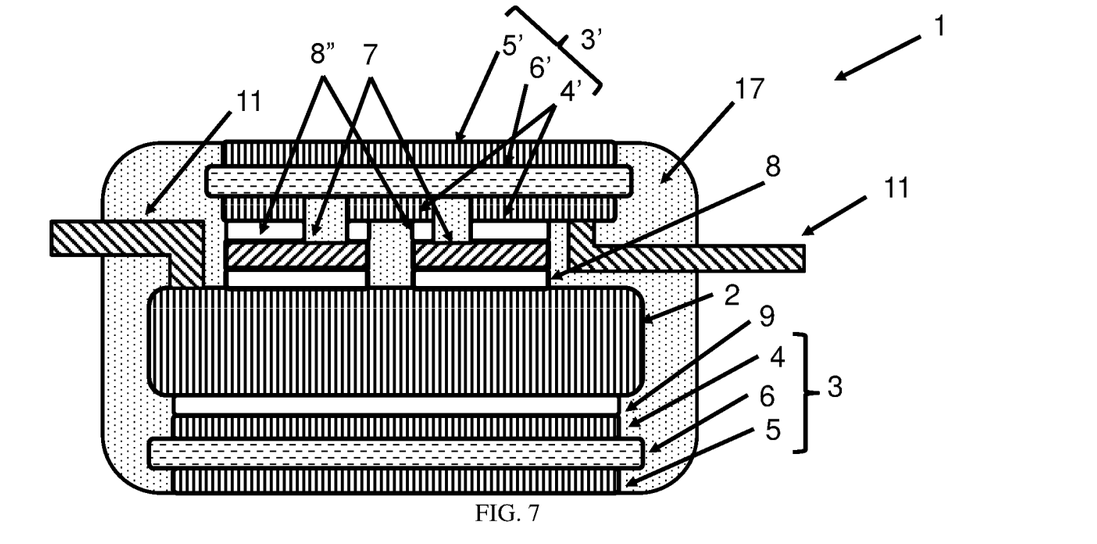
FIG. 7: shows the cross section of a module arrangement for semiconductor devices according to a fourth embodiment of the invention.

A fourth embodiment depicted in FIG. 7 comprises the conductive layer 4' and the joining layer 8" that are structured/segmented in separate regions, some regions thereof connected to the control regions of the semiconductor devices 7, and some regions thereof connected to the current flow regions of the semiconductor devices 7. This can be applied if the thickness of the joining layer 8" is not large enough to safely accommodate the connections to the control regions of the semiconductor devices 7.

Figure 8:
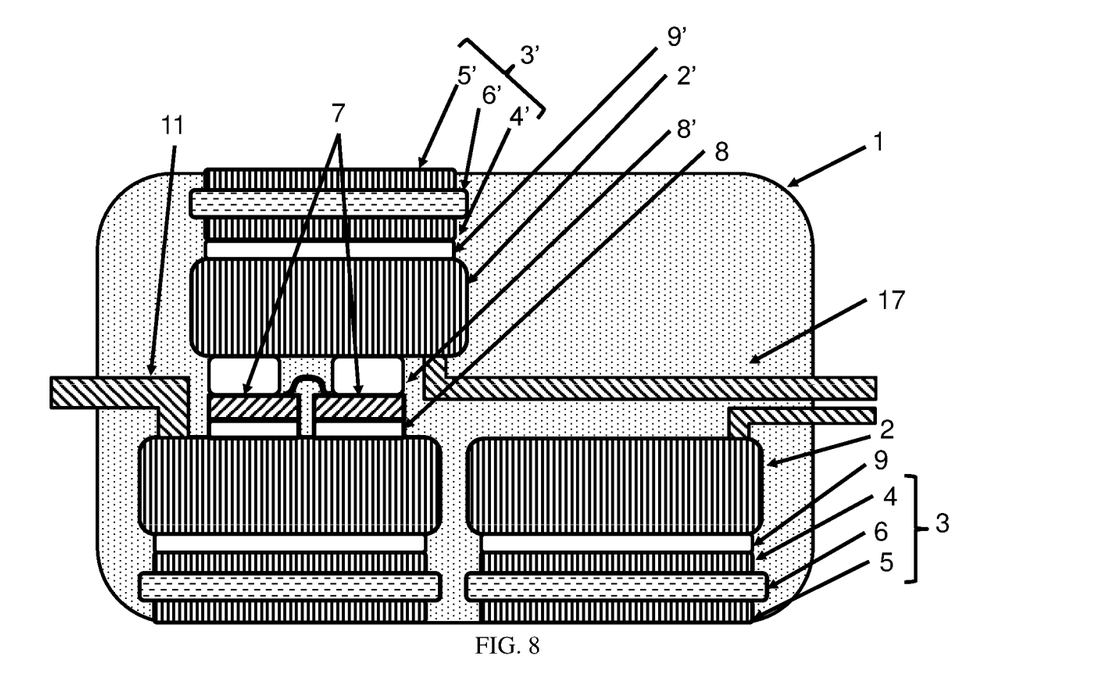
FIG. 8: shows the cross section of a module arrangement for semiconductor devices according to a fifth embodiment of the invention.

Furthermore, in a fifth embodiment as depicted in FIG. 8, a second heat spreading layer 2' can be attached on the first surface of the semiconductor devices 7 (i.e. opposite the semiconductor surface adjacent to the joining layer 8) through a joining layer 8'. The thickness of the joining layer 8' should be large enough to accommodate electrical contacts to the control regions of the semiconductor devices 7 without electrical shorting of the second heat spreading layer 2', as depicted by the small wire contact between the semiconductor devices 7 in FIG. 8. The second heat spreading layer 2' can be made of similar material as the heat spreading layer 2' or from a different material, and can have any properties as similar as or as different as the properties of the heat spreading layer 2. Furthermore, a second electrical isolation stack 3' is attached to the second heat spreading layer 2' such that the conductive layer 4 on its first surface is in contact with the second heat spread layer 2' through an additional joining layer 9. The electrically insulating layer 6 of the first electrical isolation stacks and the electrically insulating layer 6' of the second electrical isolation stack 3' can be made of similar or different materials, and can have similar or different properties (i.e. thickness, etc). The electrically conductive layers 4 and 5 of the first electrical isolation stack 3 and the electrically conductive layers 4' and 5' of the second electrical isolation stack 3' can be made of similar or different materials, and can have similar or different properties (i.e. thickness, etc). The power semiconductor devices 7, the heat spreading layer 2, the second heat spreading layer 2', the first electrical isolation stack 3, the second electrical isolation stack 3' are enclosed in a volume of mold or resin 17, leaving only the layer 5 of the first isolation stack 3 and the layer 5' of the second isolation stack 3' exposed to the surrounding environment. Such a module arrangement could provide enhanced capability for double side cooling of the semiconductor devices 6.

The present invention can also be flexibly applied to configurations wherein multiple module arrangements comprising semiconductor devices, one or more heat spreading layers, one or more electrical isolation layers as described previously, can be interconnected and stacked providing for a three-dimensional module enclosed in the same molded volume.

In other embodiments, the material of the semiconductor devices 7 may be different than Silicon, for example the semiconductor devices may be made of Silicon Carbide, Gallium Nitride, Gallium Oxide, Zinc Oxide, Diamond or the like. In this case, the same embodiments as described above can be applied, however the specific dimensions (i.e. area in a top plane view or thickness) of the semiconductor dies 7, of the heat spreading layer 2, of the electrical isolation stack 3, will be adjusted accordingly by means known to those experts in the field.

REFERENCE LIST

1: inventive module
2: heat spreading layer
2': second heat spreading layer
3: first electrical isolation stack
4: electrically conductive layer, first surface of the first electrical isolation stack
5: electrically conductive layer, second surface of the first electrical isolation stack
6: electrically insulating layer in the first electrical isolation stack
3': second electrical isolation stack
4': electrically conductive layer, first surface of the second electrical isolation stack
5': electrically conductive layer, second surface of the second electrical isolation stack
6': electrically insulating layer in the second electrical isolation stack
7: semiconductor devices
8: joining layer between the semiconductor device and heat spreading layer at the second surface of the semiconductor device
8': joining layer between the semiconductor device and second heat spreading layer/second electrical isolation stack at the first surface of the semiconductor device
8'': joining layer between the semiconductor device and the first surface of the second electrical isolation stack at the first surface of the semiconductor device
9: joining layer between the heat spreading layer and an electrical isolation stack
9': joining layer between the second heat spreading layer and the second electrical isolation stack
10: electrical connections (i.e. wire bonds, ribbons or other electrical contacting method)
11: power terminal
12: control terminal
13: internal connection layer
14: baseplate
15: module frame
16: silicone gel
17: mold/resin encapsulation
200: Module (prior art)
201: Module (prior art)

The invention claimed is:

1. A module arrangement for housing multiple semiconductor devices, comprising:
two or more heat spreading layers, each having a first surface and a second surface being arranged opposite to the first surface and being formed of a least one highly electrically and thermally conductive material;
two or more semiconductor devices having a first surface and a second surface opposite the first surface and contacting a same first surface of a heat spreading layer through a joining layer;
two or more electrical isolation stacks each having a first surface and a second surface being arranged opposite to the first surface, each disposed with its first surface in contact with the second surface of a heat spreading layer, wherein each comprises at a minimum an electrically conductive layer on its first surface and an electrically insulating layer below its first surface,
wherein, in a top plane view, an area of at least one of the two or more heat spreading layers is greater than or equal to an area of at least one of the two or more electrical isolation stacks,
wherein a joining structure connects the first surfaces of the two or more semiconductor devices to a different heat spreading layer, and
wherein a mold or resin enclosure seals the two or more heat spreading layers, two or more semiconductor devices and two or more electrical isolation stacks apart from the respective second surfaces of the two or more electrical isolation stacks.

2. The module arrangement according to claim 1, wherein a thickness of the two or more heat spreading layers is more than one order of magnitude larger than a thickness of the two or more semiconductor devices and a thickness of the two or more electrical isolation stacks.

3. The module arrangement according to claim 1, wherein a surface area of the two or more of the heat spreading layers in a top plane view is smaller than 10 cm$^2$.

4. The module arrangement according to claim 1, wherein the electrically insulating layer of the electrical isolation stack has a thermal conductivity range between 10 W/(m·K) and 50 W/(m·K).

5. The module arrangement according to claim 1, wherein multiple electrical conducting layers are arranged for externally contacting the two or more semiconductor devices being comprised by said module through the enclosure.

6. The module arrangement according to claim 1, wherein a portion of the two or more heat spreading layers have control electronics, sensors or gate driver circuits attached to their respective first surfaces.

7. The module arrangement according to claim 1, wherein the shape of a heat spreading layer in a top plane view is a polygon.

8. The module arrangement for housing semiconductor devices according to claim 1, further comprising one or more second electrical isolation stacks having a first surface and a second surface being arranged opposite to the first surface, disposed with the first surface in contact with a first surface of the two or more semiconductor devices, wherein each second electrical isolation stack comprises at a minimum an electrically conductive layer on its first surface and an electrically insulating layer, and wherein, the one or more second electrical isolation stacks, apart from their second surfaces, are sealed in the mold or resin enclosure.

9. The module arrangement according to claim 8, wherein at least one of the two or more semiconductor devices comprises a control region and a current flow region, and wherein the electrically conductive layer on the first surface of the one or more second isolation stacks is structured in separated regions that are connected either to the control regions or to the current flow regions of the at least one of the two or more semiconductor devices.

10. The module arrangement for housing semiconductor devices according to claim 1, further comprising:

one or more second heat spreading layers having a first surface and a second surface being arranged opposite to the first surface, disposed with their first surface in contact with a first surface of the two or more semiconductor devices, one or more second electrical isolation stacks having a first surface and a second surface being arranged opposite to the first surface, disposed with the first surface in contact with the second surface of the second heat spreading layers, wherein each second electrical isolation stack comprises at a minimum an electrically conductive layer on its first surface and an electrically insulating layer, and wherein, the one or more second heat spreading layers and the one or more second electrical isolation stacks are sealed in the mold or resin enclosure apart from the second surface of the one or more second electrical isolation stacks.

11. The module arrangement according to claim 1, wherein at least one of the two or more semiconductor devices comprises Silicon or a Wide bandgap material.

* * * * *